United States Patent [19]

Landau et al.

[11] Patent Number: 5,454,710

[45] Date of Patent: Oct. 3, 1995

[54] DISPLAY SYSTEM FOR A BATTERY MONITORING CIRCUIT

[75] Inventors: John E. Landau, Dallas; Wallace E. Matthews, Richardson; David L. Freeman, Plano, all of Tex.

[73] Assignee: Benchmarq Microelectronics, Inc., Dallas, Tex.

[21] Appl. No.: 193,439

[22] Filed: Feb. 8, 1994

Related U.S. Application Data

[63] Continuation of Ser. No. 910,687, Jul. 8, 1992, Pat. No. 5,284,719.

[51] Int. Cl.⁶ .................................................. H01M 10/48
[52] U.S. Cl. ........................... 429/50; 429/93; 324/427; 324/431
[58] Field of Search ................................ 429/50, 92, 93; 324/427, 431

[56] References Cited

U.S. PATENT DOCUMENTS

| 3,307,101 | 2/1967 | Byles . |
| 3,421,067 | 1/1969 | Wilson et al. . |
| 3,617,851 | 11/1971 | DuPuy et al. . |
| 3,778,702 | 12/1973 | Finger . |
| 3,786,343 | 1/1975 | Ehlers . |
| 3,794,905 | 2/1975 | Long . |
| 3,876,921 | 4/1975 | Bigbee, III . |
| 3,886,442 | 5/1975 | Chiku et al. . |
| 3,890,556 | 6/1975 | Melling et al. . |
| 3,906,329 | 9/1975 | Bader . |
| 3,924,188 | 12/1975 | Hofbauer . |
| 3,932,797 | 1/1976 | York . |
| 3,936,718 | 2/1976 | Melling et al. . |
| 3,938,021 | 2/1976 | Kosmin . |
| 3,940,679 | 2/1976 | Brandwein et al. . |
| 3,944,904 | 3/1976 | Hase . |
| 3,969,667 | 7/1976 | McWilliams ............ 324/29.5 |
| 3,979,657 | 9/1976 | Yorksie . |
| 4,006,397 | 2/1977 | Catotti et al. . |
| 4,017,724 | 4/1977 | Finger . |
| 4,021,718 | 5/1977 | Konrad . |
| 4,025,916 | 5/1977 | Arnold et al. . |
| 4,061,956 | 12/1977 | Brown et al. . |

(List continued on next page.)

FOREIGN PATENT DOCUMENTS

| 0225106 | 6/1987 | European Pat. Off. . |
| 0300537 | 1/1989 | European Pat. Off. . |
| 0498715A1 | 8/1992 | European Pat. Off. . |
| 2361754 | 3/1978 | France . |
| 3520985A1 | 12/1986 | Germany . |
| 2069780 | 8/1981 | United Kingdom . |
| WO91/16753 | 10/1991 | WIPO . |
| WO92/15893 | 9/1992 | WIPO . |
| WO93/15412 | 8/1993 | WIPO . |

*Primary Examiner*—Stephen Kalafut
*Attorney, Agent, or Firm*—Gregory M. Howison

[57] ABSTRACT

A battery detect circuit (32) is connected to a battery, with the current input to the battery and the current extracted from the battery measured with a sense resistor (50) and convened to charge and discharge voltages with a V/F converter (52). A microcontroller (64) is operable to increment a nominal available charge (NAC) register (180) during a charge operation and to increment a discharge rate counter (DCR) (184) during a discharge operation. The NAC register (180) indicates the available charge, i.e. the charge state of the battery, which value is output to a display (34). The display (34) is controlled to operate in either an absolute full mode or a relative full mode. This is determined by an external programming pin which has first and second programming states associated with the two modes. In the absolute full mode, a Programmed Full Count (PFC) determines the upper capacity value of the display (34), which PFC is predetermined and represents the maximum capacity of the battery when the battery is new. The charge state value displayed is then determined relative to the maximum capacity value. In the relative full mode, the actual capacity of the battery is determined and defines the upper capacity value of the display (34). A translation device (186) is operable to vary the output of the NAC register (180) as a function of temperature, this changed in discrete steps.

15 Claims, 7 Drawing Sheets

U.S. PATENT DOCUMENTS

| | | |
|---|---|---|
| 4,118,661 | 10/1978 | Siekierski et al. . |
| 4,139,896 | 2/1979 | Finger . |
| 4,153,867 | 5/1979 | Jungfer et al. . |
| 4,180,770 | 12/1979 | Eby . |
| 4,181,885 | 1/1980 | Gosser et al. . |
| 4,191,918 | 3/1980 | Nicholls . |
| 4,193,026 | 3/1980 | Finger et al. . |
| 4,203,103 | 5/1980 | Osada et al. . |
| 4,209,736 | 6/1980 | Reidenbach . |
| 4,225,815 | 9/1980 | Lind et al. . |
| 4,234,840 | 11/1980 | Konrad et al. . |
| 4,238,721 | 12/1980 | DeLuca et al. . |
| 4,247,812 | 1/1981 | Patry et al. . |
| 4,288,734 | 9/1981 | Finger . |
| 4,289,836 | 9/1981 | Lemelson . |
| 4,304,823 | 12/1981 | Lemelson ............... 429/93 X |
| 4,308,492 | 12/1981 | Mori et al. . |
| 4,320,334 | 3/1982 | Davis et al. . |
| 4,333,149 | 6/1982 | Taylor et al. . |
| 4,354,148 | 10/1982 | Tada et al. . |
| 4,371,826 | 2/1983 | Shelly . |
| 4,385,269 | 5/1983 | Aspinwall et al. . |
| 4,388,582 | 6/1983 | Saar et al. . |
| 4,390,841 | 6/1983 | Martin et al. . |
| 4,392,101 | 7/1983 | Saar et al. . |
| 4,394,741 | 7/1983 | Lowndes . |
| 4,413,221 | 11/1983 | Benjamin et al. . |
| 4,418,310 | 11/1983 | Bollinger . |
| 4,431,245 | 2/1984 | Jigamian et al. . |
| 4,433,277 | 2/1984 | Carollo et al. . |
| 4,455,523 | 6/1984 | Koenck . |
| 4,460,870 | 7/1984 | Finger . |
| 4,514,694 | 4/1986 | Finger . |
| 4,525,055 | 6/1985 | Yokoo . |
| 4,549,127 | 10/1985 | Taylor et al. . |
| 4,553,081 | 11/1985 | Koenck . |
| 4,558,281 | 12/1985 | Codd et al. . |
| 4,575,669 | 3/1986 | Brown . |
| 4,583,034 | 3/1986 | Martin . |
| 4,583,035 | 4/1986 | Sloan . |
| 4,595,880 | 6/1986 | Patil . |
| 4,609,860 | 9/1986 | Fasen . |
| 4,622,509 | 11/1986 | Spruijt . |
| 4,626,765 | 12/1986 | Tanaka . |
| 4,629,965 | 12/1986 | Fallon et al. . |
| 4,638,237 | 1/1987 | Fernandez . |
| 4,639,655 | 1/1987 | Westhaver et al. . |
| 4,677,363 | 6/1987 | Kopmann . |
| 4,680,527 | 7/1987 | Benenati et al. . |
| 4,692,680 | 9/1987 | Sherer . |
| 4,693,119 | 9/1987 | Johnson . |
| 4,703,247 | 10/1987 | Morioka . |
| 4,709,702 | 11/1987 | Koenck . |
| 4,716,354 | 12/1987 | Hacker . |
| 4,724,528 | 2/1988 | Eaton . |
| 4,725,784 | 2/1988 | Peled et al. ............... 324/427 |
| 4,737,702 | 4/1988 | Koenck . |
| 4,743,831 | 5/1988 | Young . |
| 4,746,854 | 5/1988 | Baker et al. . |
| 4,767,977 | 8/1988 | Fasen et al. . |
| 4,774,493 | 9/1988 | Rabinowitz . |
| 4,775,827 | 10/1988 | Ijntema et al. . |
| 4,800,336 | 1/1989 | Mikami et al. . |
| 4,803,416 | 2/1989 | Abiven et al. . |
| 4,816,735 | 3/1989 | Cook et al. . |
| 4,820,965 | 4/1989 | Siemer . |
| 4,829,226 | 5/1989 | Nakamura et al. . |
| 4,839,248 | 6/1989 | Magnusson et al. ............... 429/50 X |
| 4,843,299 | 6/1989 | Hutchings . |
| 4,845,419 | 7/1989 | Hacker . |
| 4,847,546 | 7/1989 | Bobier et al. . |
| 4,849,700 | 7/1989 | Morioka et al. . |
| 4,857,820 | 8/1989 | Tompkins et al. . |
| 4,876,513 | 10/1989 | Brilmyer et al. . |
| 4,885,523 | 12/1989 | Koenck . |
| 4,888,716 | 12/1989 | Ueno . |
| 4,918,368 | 4/1990 | Baker et al. . |
| 4,929,931 | 5/1990 | McCuen . |
| 4,931,737 | 6/1990 | Hishiki . |
| 4,947,123 | 8/1990 | Minezawa . |
| 4,949,046 | 8/1990 | Seyfang . |
| 4,952,862 | 8/1990 | Biagetti et al. . |
| 4,958,127 | 9/1990 | Williams et al. . |
| 4,961,043 | 10/1990 | Koenck . |
| 4,965,738 | 10/1990 | Bauer et al. . |
| 5,012,176 | 4/1991 | LaForge . |
| 5,033,027 | 7/1991 | Amin . |
| 5,048,804 | 9/1991 | Ito . |
| 5,049,803 | 9/1991 | Palanisamy . |
| 5,119,011 | 6/1992 | Lambert ............... 320/43 |
| 5,204,611 | 4/1993 | Nor et al. . |
| 5,237,259 | 8/1993 | Sanpei . |
| 5,315,228 | 5/1994 | Hess et al. . |
| 5,315,549 | 5/1994 | Scherpenberg et al. . |

DISPLAY SYSTEM FOR A BATTERY MONITORING CIRCUIT

CROSS REFERENCE TO RELATED APPLICATIONS

This application is a continuation of U.S. Ser. No. 07/910,687, filed Jul. 8, 1992, now U.S. Pat. No. 5,284,719, issued Feb. 8, 1994 (Atty. Dkt. No. BENC-19,821), entitled "Method and Apparatus for Monitoring Battery Capacity", and is related to U.S. patent application Ser. No. 07/910,685, filed Jul. 8, 1992 (Atty. Dkt. No. BENC-19,786), entitled "Method and Apparatus for Monitoring Battery Capacity Under Fast Discharge Conditions", and to U.S. patent application Ser. No. 07/910,688, filed Jul. 8, 1992 (Atty. Dkt. No. BENC-21,168), entitled "Method and Apparatus for Monitoring Battery Capacity with Charge Control".

TECHNICAL FIELD OF THE INVENTION

The present invention pertains in general to rechargeable batteries and, more particularly, to circuitry for controlling the charging operation and monitoring the parameters of the battery during and after the recharging o operation.

BACKGROUND OF THE INVENTION

With the advent of portable electronic systems for personal and business use, rechargeable batteries have seen an increased and widespread use. One problem that has risen with respect to rechargeable batteries has been the length of time that a battery can be used after it has been charged. Although manufacturers rate a battery for a given portable computer or battery operated device as to the number of hours that it will operate, the actual operating time is a function of a number of parameters. For example, personal computers provide a variable load which is a function of the peripheral devices that are activated, such as the screen, the hard disk, etc., such that the operating life of the battery will vary as a function of how often these peripheral devices are used. Power consumption by the peripherals has conventionally been reduced by utilizing increasingly sophisticated power management tools to minimize the mount of power that is drained from the battery, thus extending the operating time of the battery for a given charge. Another problem encountered with rechargeable batteries is partial charging. The manufacturers specifications are directed toward a relatively new battery with a "full" charge. If, for some reason, the battery does not have a full charge, the user has no knowledge of how much operating time he has on a particular battery. Since rechargeable batteries typically have a relatively flat voltage over their charge life, very little warning is typically available as to when the battery is nearing its end of discharge. Further, the condition of a battery, i.e., its age, etc., also effects the amount of charge that can be stored in a given battery. This could result in a fully charged battery driving the battery operated device for a shorter period of time than expected.

Battery-pack systems have been developed to provide information regarding the condition of the battery, the state of charge of the battery, etc., with these devices integrated into the battery-pack itself. Such a device is disclosed in U.S. Pat. No. 4,289,836, issued to Lemelson on Sep. 15, 1981. These battery-pack systems have been utilized with the battery to both condition the battery and provide some information as to the amount of charge that is in the battery, i.e., a measure of its capacity. These conditioning systems typically monitor and control the charging operation to determine when the voltage has reached a state that represents a flail charge. Periodically, the battery is completely discharged for conditioning purposes. The capacity is learned by measuring the charge supplied to the battery from a condition where the battery is at its end of discharge voltage, and is charged to a full voltage. This charge monitoring circuitry is typically a device that measures current through a known resistive value and calculates charge therefrom.

One disadvantage to the present battery-pack systems is that in order to make some determination as to capacity, it is necessary for the charging operation to be an integral part of the capacity determining operation. However, systems having a totally self-contained charging unit that is separated from the battery have no way of storing capacity information with the battery after it is disconnected. As such, such systems do not provide battery capacity information.

SUMMARY OF THE INVENTION

The present invention disclosed and claimed herein comprises a display for a battery monitoring system that monitors the charge state of a battery which has a rated maximum capacity and an actual capacity. The display includes a battery monitoring circuit for determining the charge state of the battery and the actual capacity of the battery. A register is provided for storing the rated maximum capacity value representing the value of the battery when it is new. A display dement displays the charge state of the battery extending from a lower capacity value to an upper capacity value. A display controller operates a display element either in an absolute full mode or a relative full mode. When operating in the absolute full mode, the upper capacity value is set to the maximum capacity value stored in the register and the charge state is displayed in the display element relative to the maximum capacity value. When operating in the relative full mode, the upper capacity value is set equal to the determined actual capacity of the battery and the charge state is displayed relative to the actual capacity of the battery.

In another aspect of the present invention, a switching device is provided for switching the display controller between the absolute full mode and the relative full mode. The switching device operates in response to a programming signal received on an external programming pin. The programming pin operates in a first programming state associated with the absolute full mode and in a second programming state associated with the relative full mode.

In yet another aspect of the present invention, a temperature translation device is provided. The temperature translation device varies the charge state determined by the battery monitoring circuit as a function of temperature. The charge state is varied by a predetermined offset value that is a function of temperature. This offset value is changed in discrete steps as a function of temperature.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
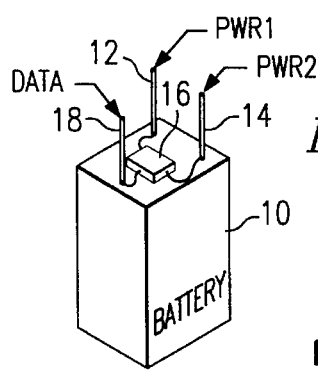
FIG. 1 illustrates a perspective view of a battery-pack system.

Referring now to FIG. 1, there is illustrated a perspective view of a battery-pack. In general, the battery-pack is comprised of a battery 10 having power terminals 12 and 14 labeled PWR 1 and PWR 2, respectively. The power terminals 12 and 14 are operable to receive the two polarities of the battery. Connected to the two terminals of batteries 12 and 14 is the battery monitoring circuit 16. The battery monitoring circuit 16 is connected to a third terminal 18 that is operable to allow data to be transferred to and from the battery monitoring circuit 16, as will be described hereinbelow.

Figure 2:
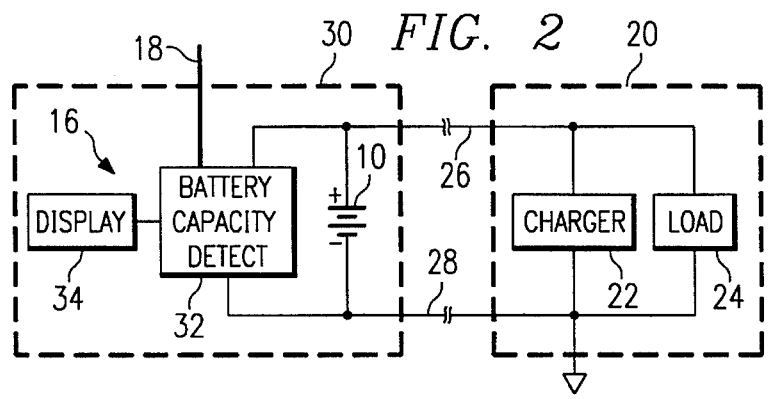
FIG. 2 illustrates a diagrammatic view of the isolated battery capacity detect circuit and charger.

Referring now to FIG. 2, there is illustrated an interconnection diagram for the overall charging and monitoring operation. The battery charger is disposed in an isolated housing 20 which is comprised of a battery charger 22 and a load 24, the load 24 being provided in the event that the charger is disconnected from the battery. Two wires 26 and 28 are connected to opposite sides of the charger to carry the charging current therefrom. These extend external to the overall housing 20. They are connected to a battery-pack 30 that houses the battery 10 and the battery monitoring circuit 16. The battery monitoring circuit 16 is comprised of a battery capacity detect circuit 32 and a display 34. The battery capacity detect circuit 32 interfaces with the terminal 18 to allow data communication therewith. The battery charger 22 is operable to monitor and control the charging operation. In the charging operation, a current is typically applied to the battery terminals 10 until a predefined charge termination condition is reached, at which time the charging current is disabled and/or the current is reduced to a trickle charge level. The charger 22 further can have modes of operation wherein the current is delivered at different rates, it is pulsed, etc. These are well known techniques for effectively charging the battery 10. Further, circuitry can be provided for periodically conditioning the battery 10 by fully discharging and then charging it all the way to full state of charge. However, it can be seen that since the battery-pack 30 and the charger 22 are isolated and disconnectable, any information regarding the battery must be contained within the battery-pack 30.

Figure 3:
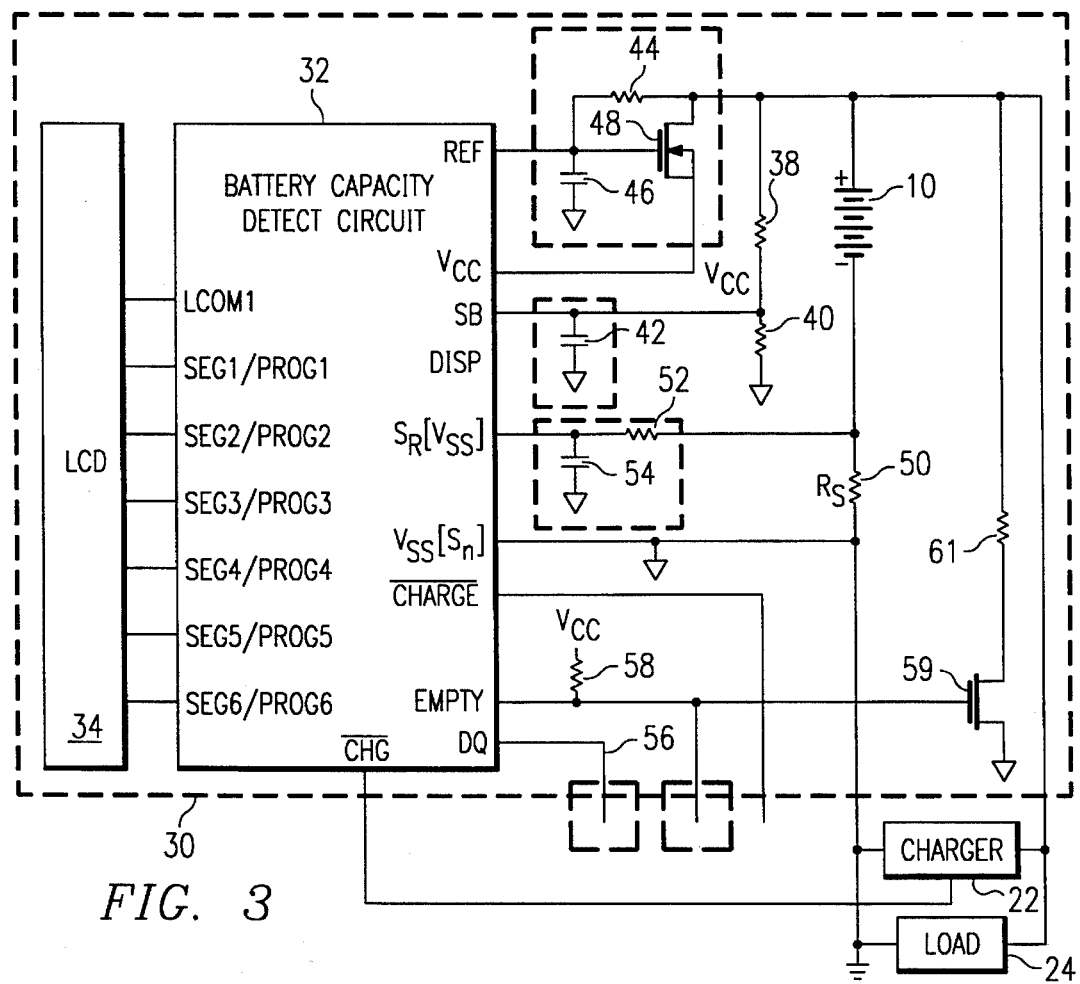
FIG. 3 illustrates a chip level block diagram of the battery capacity detect circuit.

Referring now to FIG. 3, there is illustrated a chip level block diagram of the battery capacity detect circuit 32 and the display 34, illustrating the peripheral circuitry that is connected to the battery capacity detect circuit. The battery 10 has the positive terminal thereof connected to one side of a resistive divider comprised of resistors 38 and 40 with the common connection between resistors 38 and 40 connected to the SB-input of the detect circuit 32, a capacitor 42 provided for noise filtering purposes. The other side of the resistor divider is connected to ground. This basically provides a divided voltage from the battery full potential. The positive terminal of battery 10 is also connected to one side of a resistor 44, the other side of which is connected to a reference input. A filter capacitor 46 is connected between the reference input and ground. The reference terminal is also connected to the gate of a field effect transistor 48, the source/drain path thereof connected between the positive terminal of the battery 10 and the $V_{cc}$ input of the detect circuit 32. A reference voltage output of the detect circuit 32 provides a control voltage to the transistor 48 to regulate the voltage $V_{cc}$ from the battery terminal 10.

A sense resistor 50 is provided, having a value of approximately 0.1 Ohms to 0.02 Ohms. One side of sense resistor 50 is connected to the negative terminal of battery 10, and the other side of sense resistor 50 is connected to ground. The negative terminal of battery 10 is also connected through a resistor 52 to the sense resistor input terminal $S_R$. A filter capacitor 54 is connected between the $S_R$ terminal and ground.

A serial input/output DQ is provided for allowing serial communication with a serial bus 56. The serial bus 56 communicates with the data lead 18. Another output, EMPTY provides a status output. A pull up resistor 58 is connected between the EMPTY output and $V_{cc}$. The EMPTY terminal is essentially a status output that provides at least one status signal, that indicating when an End of Discharge Voltage value has been reached for the battery 10. However, multiple status signals could be output with the use of internal multiplexing functions.

The display 34 is illustrated as being a Light Emitting Diode (LED). The LED display 34 has five segments that are connected to six segment outputs and a common output. However, it should be understood that an LED display could also be utilized.

Figure 4:
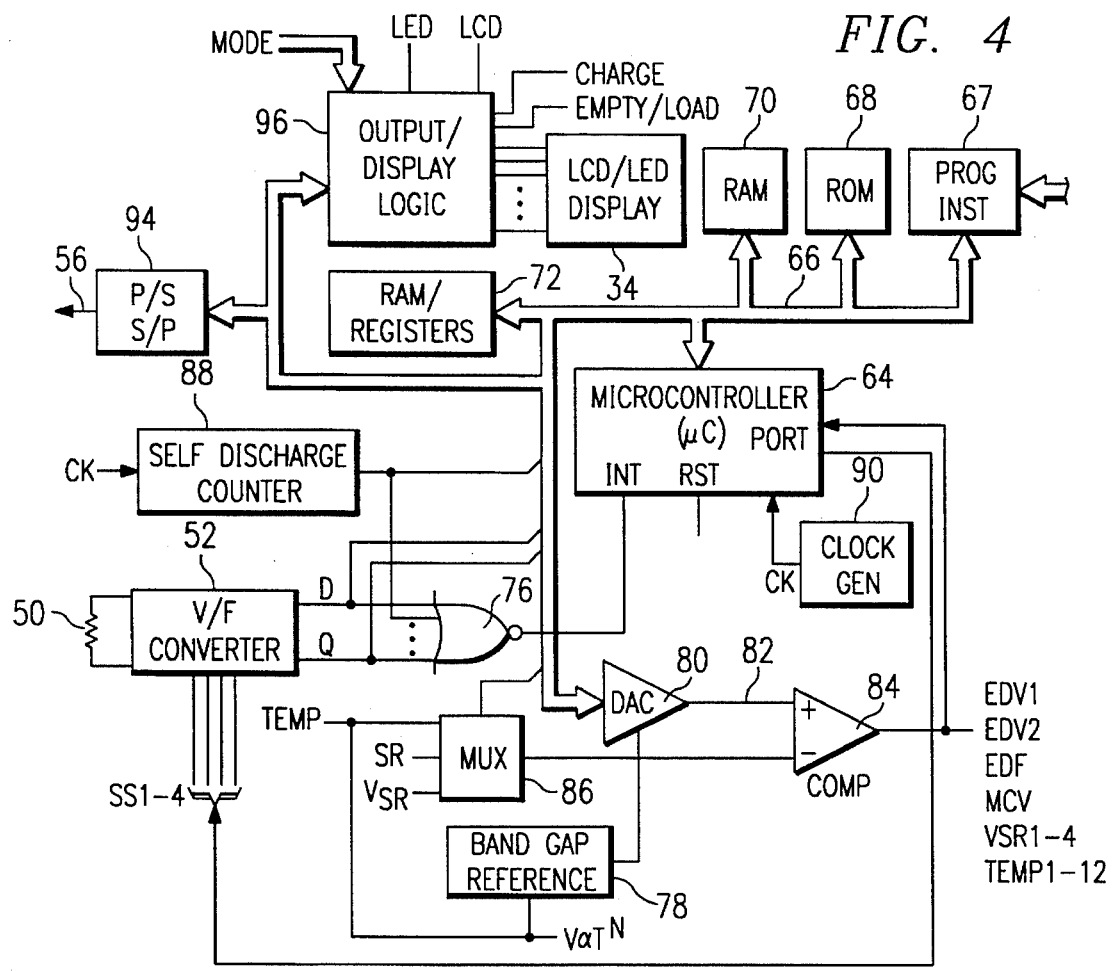
FIG. 4 illustrates a logic block diagram of the battery capacity detect circuit.

Referring now to FIG. 4, there is illustrated a block diagram of the battery capacity detect circuit 32. The overall operation of the system is controlled by a central microcontroller 64. The microcontroller 64 is operable to interface through an address/data bus 66 with a Program Instruction block 67, a Read Only Memory (ROM) 68, in which program instructions are stored. A Random Access Memory (RAM) 70 is also provided and is interfaced with the address/data bus 66. The microcontroller 64 is also interfaced through the address/data bus 66 with a dual port RAM/register combination 72. The bus 66 is essentially comprised of a plurality of data lines, address lines and control lines. The dual port RAM/register combination 72 allows the peripheral circuitry associated with the microcontroller 64 to communicate therewith through buffers for setting flags, storing data words, etc. Further, the microcontroller 64 can also store commands in the various registers for output to the various peripheral circuits.

The sense resistor 50 is connected on either end thereof to the input of a voltage/frequency (V/F) converter 52 which is operable to convert the voltage to a variable pulse output. Two outputs are provided, a D-output and a Q-output. These are interrupts which are input to a multi-input NOR gate 76. The output of the NOR gate 76 is connected to the interrupt input on the microcontroller 64. Additionally, the D-output and the Q-output are connected to the bus 66 for interconnection with the dual port RAM/register combination 72. As will be described hereinbelow, the V/F converter 52 is operable to generate a pulse stream on the Q-output representing a charging operation wherein a pulse stream on the D-output represents a discharge operation. The frequency of the pulses represents the relative discharge/charge rate, with a higher frequency indicating a higher discharge/charge rate and lower frequency representing a lower discharge/charge rate.

A band gap reference circuit 78 is provided for generating a reference voltage. The band gap reference voltage is a conventional type of circuit, the reference voltage output being utilized primarily for the input to a Digital-to-Analog Converter (DAC) 80 and the V/F converter 52. The DAC 80 has digital input thereof connected to the bus 66 to receive a data word therefrom. The data word represents a voltage level, which voltage level is generated by the microcontroller 64. This is converted to an analog voltage on an output line 82 for input to the positive input of a comparator 84 as the reference voltage. The negative input of the comparator 84 is connected to the output of a multiplexer 86. The multiplexer 86 is operable to select one of the multiple input voltages for input to the negative input of the comparator 84. The multiplexer 86 primarily receives the voltage output of the sense resistor $V_{SR}$ and the SB-input, which represents the divided down potential of the battery. Further, a TEMP signal is input to the multiplexer 86, which TEMP signal represents a temperature variable voltage that is generated in the band gap reference circuit 78 and provides an indication of temperature.

The band gap reference circuit 78 is operable to generate internal voltages that are not temperature compensated, these voltages then Combined to provide a compensated output to the DAC 80. One of the internal uncompensated voltages provides the TEMP input to the multiplexer 86. The multiplexer 86 is controlled by a control signal received from the bus 66.

The comparator 84 is operable to output a number of signals that indicate when the comparator threshold has been bypassed. These are the End of Voltage signals, EDV-1, EDV-2 and EDF, EDV-1 and EDV-2 comprising early warning signals as to when the battery is nearing its End of Voltage and the EDF signal providing a final End of Voltage signal. An MCV signal is output which represents the maximum cell voltage and four voltages VSR-1, VSR-2, VSR-3 and VSR-4 are also output indicating four separate values of voltage on the sense resistor, indicating magnitude of discharge. Voltages TEMP1–TEMP12 are also output to represent various temperature thresholds. The various outputs are generated by changing the digital output of the DAC 80 and then a self-discharge counter 88 provides a separate counting operation that is utilized to generate information as to the period of time that has passed since the battery has been charged. The self-discharge counter 88 is clocked by a clock signal generated by a clock generator 90, which clock generator 90 also provides a clock signal to the microcontroller 64 and the remaining circuitry. The self-discharge counter 88 is essentially a free running counter that outputs pulses with a given periodicity. As will be described hereinbelow, these pulses are utilized to increment an internal software discharge counter in order to account for self-discharge of the battery 10.

A parallel/serial serial/parallel converter 94 is provided for interfacing between the bus 66 and the serial communication line 56. The converter 94 allows communication between the bus 66 and the dual port RAM/register combination 72, with the serial bus 56 allowing information to be transferred from the serial bus 56 to the dual port RAM/register combination 72 and from the dual port RAM/register combination 72 to the serial bus 56. Further, other signals are also transferred thereto.

The bus 66 is interfaced with a display logic block 96 which interfaces with the display 34. The display 34, as described above, can either be an LCD or an LED display. The display logic block 96 can select either type of display.

The first two program pins PROG1 and PROG2 are the programmed full count inputs. Upon initialization, the microcontroller 64 reads the PROG1 and PROG2 inputs as three-level input pins, which may be resistively tied to $V_{cc}$ or $V_{ss}$ if the display is enabled, tied directly if the display is disabled, or left floating in either case. The input states define the programmed full count thresholds 1–9 as defined in the PFC column of Table 1, or readable as an independent data input if the programmed full count threshold is defined in the ROM 68. The nine PFC thresholds are each spaced approximately 10% from another.

TABLE I

| Progx | | full count | Programmed Full Count mVH selections | | | | | | | |
|---|---|---|---|---|---|---|---|---|---|---|
| | | | \|-----Prog4/5=1X---\| \|---Prog4/5=(1/8)X---\| <--[bq2010/12] | | | | | | | |
| | | | [bq2011/13]-->\|-----Prog4/5=1X---\| \|---Prog4/5=(1/8)X---\| | | | | | | | |
| 1 | 2 | | 1/80 | 1/160 | 1/320 | 1/640 | 1/1280 | 1/2560 | 1/5120 | CODE |
| H | H | 49152 | 614 | 307 | 154 | 76.8 | 38.4 | 19.2 | 9.6 | 11000000 |
| H | Z | 45056 | 563 | 282 | 141 | 70.4 | 35.2 | 17.6 | 8.8 | 10110000 |
| H | L | 40960 | 512 | 256 | 128 | 64.0 | 32.0 | 16.0 | 8.0 | 10100000 |
| Z | H | 36864 | 461 | 230 | 115 | 57.6 | 28.8 | 14.4 | 7.2 | 10010000 |
| Z | Z | 33792 | 422 | 211 | 106 | 53.0 | 26.4 | 13.2 | 6.6 | 10000100 |
| Z | L | 30720 | 384 | 192 | 96.0 | 48.0 | 24.0 | 12.0 | 6.0 | 01111000 |
| L | H | 27648 | 346 | 173 | 86.4 | 43.2 | 21.6 | 10.8 | 5.4 | 01101100 |
| L | Z | 25600 | 320 | 160 | 80.0 | 40.0 | 20.0 | 10.0 | 5.0 | 01100100 |
| L | L | 22528 | 282 | 141 | 70.4 | 35.2 | 17.6 | 8.8 | 4.4 | 01011000 |

The PROG3 pin is a scale selection input. Upon power up initialization, the microcontroller 64 reads the PROG3 pin as a three-level input pin similar to the PROG 1 and PROG2 pins. The input state defines a scale factor which is preset, or an independent data input can be provided to select a value stored in the ROM. The prestored scale factors are selected in three scales 1X, 2X, or 4X. These are utilized together with the scale factor multiplier specified by the PROG4 and PROG5 pins, as will be described hereinbelow, to select among the mVH/count scales which, for a high input results in a 1/80 mVH, for a floating input, 1/160 mVH and for a low input, 1/320 mVH. This provides the mVH per available charge value counter unit, which will also be described hereinbelow. The PROG4 and PROG5 pins provide a 3-function selection input. Upon power up, the pins are read as three-level input pins to define the scale factor multiplier, self-discharge rate selection, and discharge compensation enable/disable. These pins are readable as an independent data input to the extent that any one to all three can be defined in ROM. The pin functions are described in Table 2.

TABLE 2

| ProgX | | Scale Factor | Self-discharge | Discharge |
|---|---|---|---|---|
| 4 | 5 | multiplier | nominal rate | compensation |
| Z | Z | 1 | 1/30.5C | Enabled |
| Z | L | 1 | 1/61C | Enabled |
| Z | H | 1 | 1/30.5C | Disabled |
| L | Z | 1 | 1/61C | Disabled |
| L | L | 1/8 | 1/30.5C | Enabled |
| L | H | 1/8 | 1/61C | Enabled |
| H | Z | 1/8 | 1/30.5C | Disabled |
| H | L | 1/8 | 1/61C | Disabled |
| H | H | NA | NA | NA |

The PROG6 pin is a display mode selection pin that, upon power up initialization, defines the display mode, or is readable as an independent data input from ROM. As a display input, a floating input indicates that the display is to operate in an "absolute full reference operation" mode wherein a 100% full level is equal to the Program Full Count (PFC). It is noted that this function or mode allows for greater than the 100% full indication to be provided. When the PROG6 pin is low, this indicates a mode for "relative full reference operation", wherein a 100% full level on the display is set equal to the last measured capacity. In this mode, the display will indicate a level having as a reference the last determined capacity of the battery. In this mode, an aging battery with a reduced capacity would be accommodated wherein a "full" indication display would represent the maximum charge that the battery could contain. In the first mode, that indicated with a floating input on the PROG6 pin, an aging battery would never reach the "full" display level.

The EDV threshold voltages, EDV1, EDV2 and EDVF correspond to the first, second and final empty warning. Typical voltages are 0.95, 1.0 and 1.05, respectively. The VSR 1–4 threshold voltages provide for discharge compensation and these thresholds are 75 mv, 150 mv, 206 mv and 300 mv, respectively, the last, VSR 4, providing a value indicative of an overload. The MCV threshold relates to the maximum single-cell voltage which is set in the preferred embodiment to 1.8 volts over a range of from 10°–50° C. The temperature voltage thresholds TEMP1–12 correspond to twelve temperatures ranging from −30° C. to 80° C. in ten degree increments.

With respect to the EDV thresholds, an associated flag will be latched and remain latched, independent of the voltage on the SB input, until the next valid charge or, if the EDV state is latched at a temperature of less than 0°, until the temperature increases above 10° C. Valid EDV states are used in internal decisions and may be presented on the display and may be read out over the serial port. EDV monitoring will be disabled if $V_{SR}$ is greater than or equal to the EDV discharge compensation thresholds or the overload threshold. EDV monitoring will resume when the $V_{SR}$ drops back below the $V_{SR}$ threshold after a suitable stabilization period. The EMPTY output provides a latched indicator of an "empty" battery when the battery voltage falls below the EDV threshold which has been selected. Whenever the voltage on the SB input is greater than or equal to the MCV threshold, an indication is provided on the CHG output, which output can be then sent to the charger. If the voltage on the SB input falls below 0.1 volt, this is recognized as a "battery removed" condition.

Figure 5:
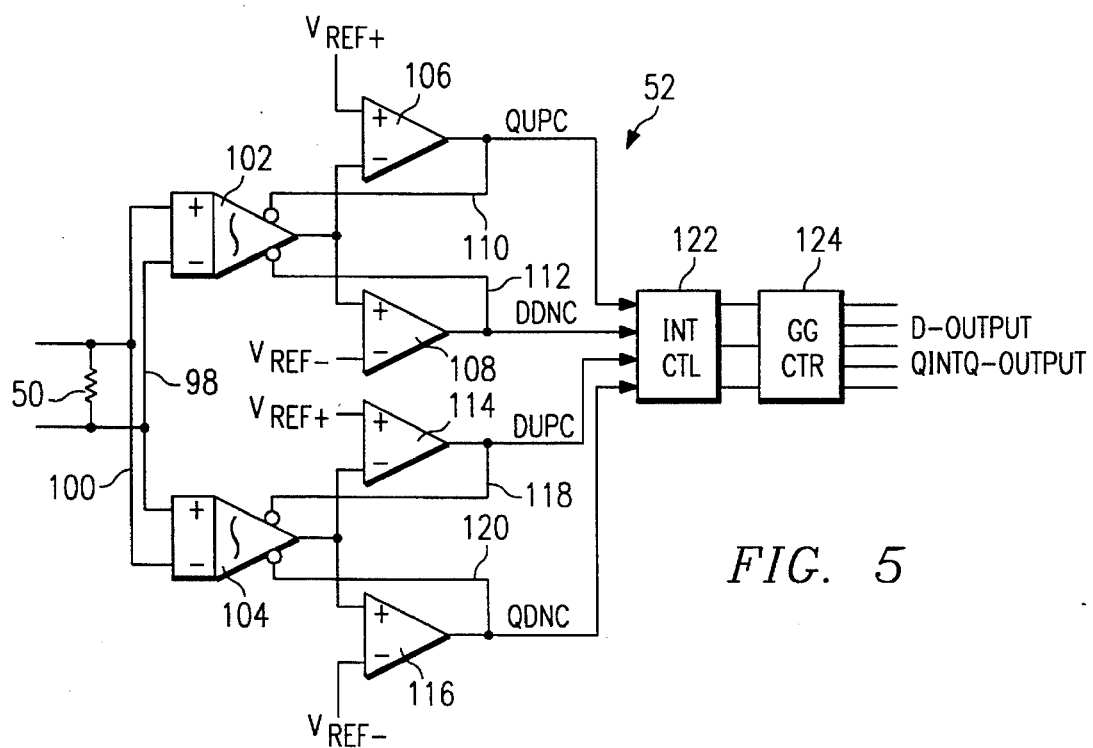
FIG. 5 illustrates a logic block diagram of the voltage/frequency converter.

Referring now to FIG. 5, there is illustrated a logic diagram of the voltage/frequency converter 52 of FIG. 3. The sense resistor 50 is connected across two input lines 98 and 100. Two integrators 102 and 104 are provided, with one integrator 102 providing an integration voltage that increases as voltage increases and the other integrator 104 providing an integration output that decreases as voltage increases. The lines 98 and 100 are connected to opposite inputs on both integrators 102 and 104. The integrator 102 has the output thereof connected to the negative input of a comparator 106 and to the positive input of a comparator 108. The positive input of comparator 106 is connected to a positive reference voltage and the negative input of comparator 108 is connected to a negative reference voltage. The positive reference voltage is at a voltage of approximately 1.2 volts and the negative reference voltage is at a voltage of approximately 0.6 volts. The output of comparator 106 provides an output QUPC that indicates an up charge count whereas the output of the comparator 108 provides an output DDNC that represents a down discharge count operation.

The output of the integrator 102 is a ramp voltage that increases as the voltage increases such that when it is above the negative reference voltage, the output of the comparator 108 will be high and when it is below the positive reference voltage, the output of comparator 106 is also high. When the voltage rises above the positive reference voltage, the output of comparator 106 goes low, and resets the integrator 102 through a line 110 to a voltage that is approximately 400 millivolts lower. This will result in the output of comparator 106 again going high, resulting in a pulse. The output of the integrator 102 will then again increase to above the positive reference voltage, assuming that the voltage across the sense resistor 50 is still high, until the output of comparator 106 again goes low. This results in a pulse stream on the output thereof having a frequency that is a function of the voltage across the sense resistor 50. During a discharge operation, the voltage polarity on sense resistor 50 will be reversed and integrator 102 will have a negative going ramp. When the negative going ramp falls below 0.6 volts, the voltage of the negative reference voltage, the output of comparator 108 will go low, inputting a reset signal to the comparator 102 through a reset line 112 to raise the voltage approximately 400 millivolts. If the discharge continues, a stream of pulses will be present on the output of comparator 108 indicating a discharge operation.

The output of integrator 104 is connected to the negative input of a comparator 114, the positive input of which is connected to the positive reference voltage. The output of integrator 104 is also connected to the positive input of a comparator 116, the negative input of which is connected to the negative reference voltage. The output of comparator 114 is connected to a reset input of the integrator 104 through a reset line 118 and the output of comparator 116 is connected to a reset input of the integrator 104 through a reset line 120. The integrator 104 provides a negative going ramp for a positive voltage and a positive going ramp for a negative voltage. Therefore, for a positive voltage, the comparator 116 Will change states when the output of integrator 104 goes below the negative reference voltage and will be reset higher by 400 millivolts through the line 120. This will result in a pulse stream on the output thereof. Similarly, when a negative voltage is present, a pulse stream will result on the output of the comparator 114.

The outputs of the comparators 106 and 108 and the comparators 114 and 116 are input to an Integrator Control Circuit (INTCTL) 122 which is operable to compare the two outputs QUPC and QDNC and the outputs DDNC and DUPC to account for offsets in the integrators 102 and 104. Since integrators 102 and 104 are identical, the offsets will cancel each other. The pulse streams are phased such that they will not overlap, such that the pulse stream that is output by the combination, which is the function of ORing the two pulse streams together, will be the offset error free pulse stream. The integrator control circuit 122 then generates three signals, one output which is high only when the charge count is present, indicating a charge, one output which is high when only the discharge count is present, indicating a discharge, one output which is high when both the charge count and discharge a count are present, indicating both states present. This therefore represents three separate states. These three separate states are input to a state machine which is comprised of a three-state counter 124 that generates the D-output and the Q-output. These are then input to the NOR gate 76 for input to the interrupt input of the microcontroller 64.

Figure 6:
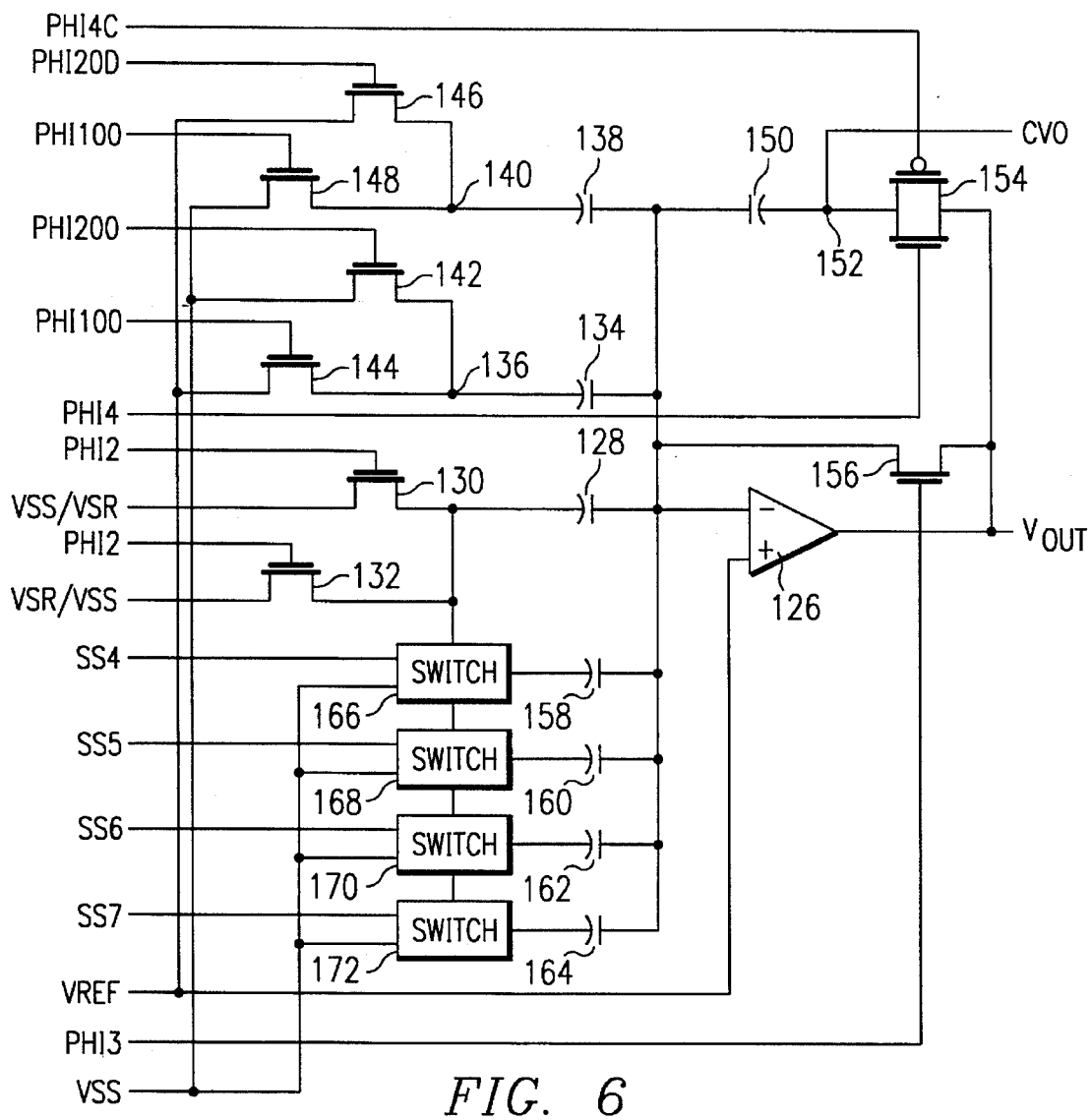
FIG. 6 illustrates a logic block diagram of the integrator.

Referring now to FIG. 6, there is illustrated a detailed logic diagram of each of the integrators 102 and 104. An operational amplifier 126 is provided having the negative input connected to the positive side of a capacitor 128 and the negative input thereof connected to a voltage $V_{REF}$. The other side of the capacitor 128 is connected to one side of the source/drain path of a transistor 130 and also to one side of the source/drain path of a transistor 132. The other side of the source/drain path of transistor 130 is connected to an input signal $V_{SR}/V_{SS}$ and the other side of the source/drain path of transistor 132 is connected to an input voltage $V_{SS}/V_{SR}$. Since the sense resistor 50 is connected between the input $V_{SR}$ and $V_{SS}$, the integrator will provide a positive integration ramp as a function of current such that when the input to transistor 132 is greater than the input to transistor 130. The gates of transistors 130 and 132 are connected to two clock signals for controlling the operation thereof to alternately dispose the negative plate of capacitor 128 at either of the two voltages. This is essentially a switched-capacitor operation. A first reset capacitor 134 has a positive plate thereof connected to the negative input of the op amp 126 and the negative input thereof connected to a node 136. A second reset capacitor 138 has the positive input thereof connected to the negative input of the op amp 126 and the negative plate thereof connected to a node 140. Node 136 is connected through the source/drain path of a transistor 142 to $V_{SS}$ and also through the source/drain path of a transistor 144 to the voltage $V_{REF}$. Similarly, the node 140 is connected through the source/drain path of a transistor 146 to $V_{REF}$ and also through the source/drain path of a transistor 148 to $V_{SS}$. The gates of transistors 142 and 144 are controlled by reset clocks to switch the bottom plate of the capacitor between $V_{SS}$ and $V_{REF}$ and, similarly, the gates of transistors 146 and 148 are controlled by reset clock signals to switch the negative plate of the capacitor 138 between $V_{SS}$ and $V_{REF}$. One of the capacitors 134 and 138 is controlled such that it is charged to $V_{REF}$ and then switched to $V_{SS}$ during a reset operation to place a negative voltage on the input to the op amp 126. The other of the two capacitors 134 and 138 has the clock signals controlled such that the negative plate thereof resides at $V_{SS}$ during normal operation and is switched to $V_{REF}$ during a reset operation to provide a positive voltage change on the input to the op amp 126. These positive and negative voltage changes result in a corresponding positive and negative voltage change on the output of the op amp 126 of approximately 400 millivolts. An integration capacitor 150 is connected between the negative input to the op amp 126 and a node 152. The node 152 is connected to one side of a transfer gate 154 comprised of a P-Channel transistor and an N-Channel transistor, the other side of the transfer gate 154 connected to the output of the op amp 126. The gates of the transistors in the transfer gate 154 are controlled by clock signals. A transistor 156 has a source/drain path connected between the negative input and the output of the op amp 126 to allow the offset of amplifier 126 to be sampled during the first phase of integration, the gate of transistor 156 controlled by a clock signal.

The rate of integration can be varied by selectively placing one of four capacitors 158, 160, 162 and 164 parallel to capacitor 128. The capacitors 158–164 have the positive plates thereof connected to the negative input of the op amp 126 and the negative plates thereof connected to switched-capacitor circuits 166, 168, 170 and 172, respectively. Each of the switched-capacitor circuits 166–172 are connected to clock signals that allow the negative plate of the capacitors 158–164 to be connected in one cycle to the negative plate of capacitor 128 and, in another cycle, to $V_{SS}$.

Figure 7:
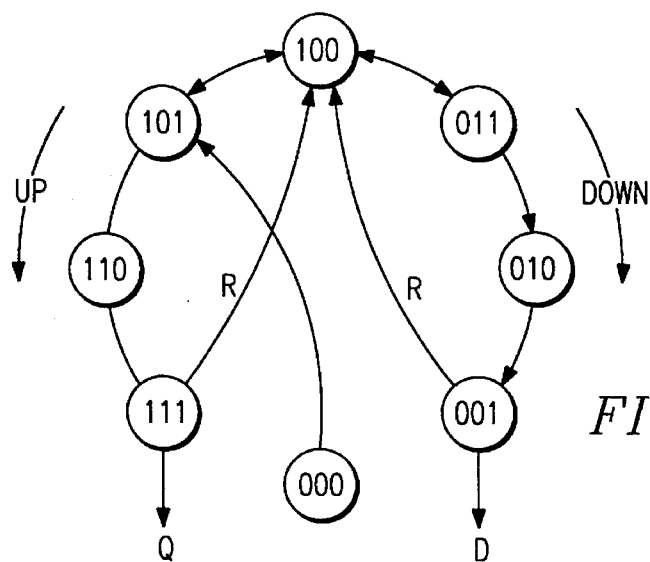
FIG. 7 illustrates a state diagram of the voltage/frequency converter.
Figure 8:
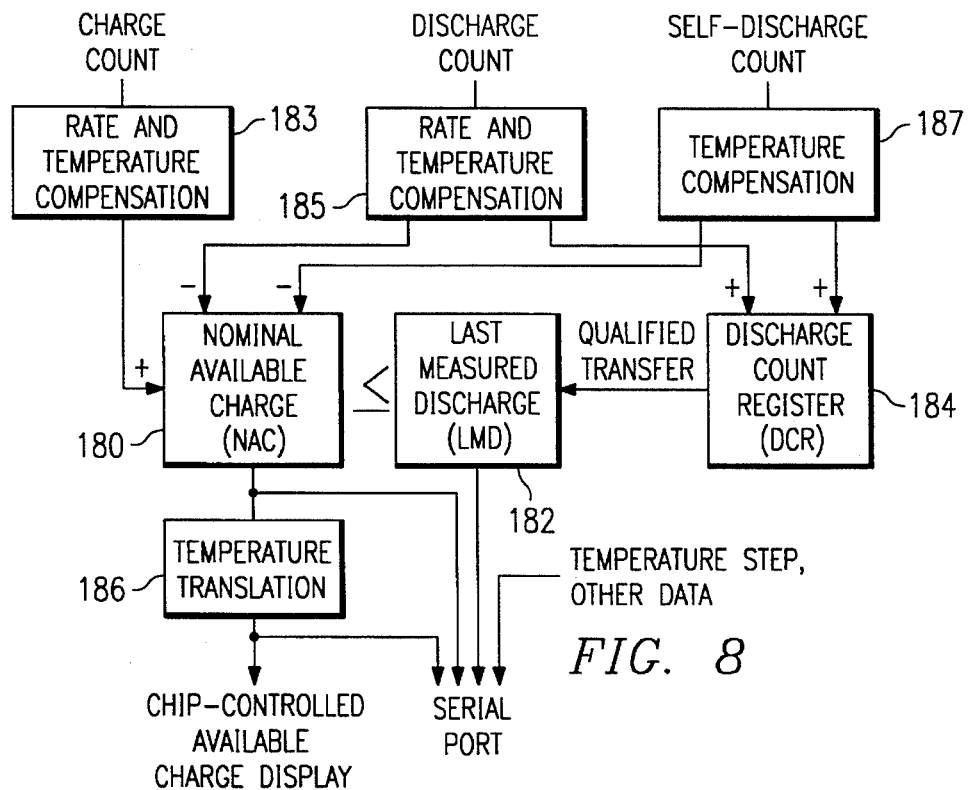
FIG. 8 illustrates an operational overviews diagram of the battery capacity detect circuit.

Referring now to FIG. 7, there is illustrated a state diagram for the operation of the three-state counter 124. There are effectively eight states represented for all the binary combinations of the three-bit input. Whatever the system is initialized with a "000", the system is reset to the state "101". Whenever a charge count is indicated, the system will count upward for each pulse output by the combination of QUPC and QDNC, indicating a charging operation. Conversely, for each pulse output by the combination of DDPC and DUPC, the count will be decremented. The three states that are input will either cause the states to increase or decrease. When they decrease to a value "001", this results in the D-output outputting a pulse. Whenever the Q-output is generated or the D-output is generated, the states will reset itself back to the state "100". As such, it will require four output pulses from the V/F converter 52 to provide one Q-output or D-output pulse. Therefore, integration control circuit 122 and the counter 124 provide a low pass filter operation on the charge count stream and the discharge count stream. As will be described hereinbelow, these two output streams are utilized to increment and decrement software counters that represent the battery capacity state. Referring now to FIG. 8, there is illustrated an operational overview of the battery detect circuit. Three registers are provided, a Nominal Available Charge (NAC) register 180, a Last Measured Discharge (LMD) register 182 and a Discharge Count Register (DCR) 184. The charge count indicated by the Q-output is compensated for both rate and temperature by the V/F converter 52 and is operable to increment the NAC value in the NAC register 180. The discharge count which is rate and temperature compensated is operable to decrement the NAC value. Additionally, the self-discharge count which is temperature compensated is operable to decrement the NAG value. The NAC register 180 provides an indication of the available charge in the battery, as will be described in more detail hereinbelow. The DCR 184 is incremented by the discharge count and by the self-discharge count. The value in the DCR 184 is transferred to the LMD 182 under certain conditions, which is termed a "qualified discharge". These conditions exist whenever there has not been a partial charge since the last full discharge, whenever the temperature is greater than 10°, whenever the self-discharge accounts for less than approximately 18% relative to PFC and whenever the battery has been fully discharged by generation of the EDV1 voltage, this indicating that the voltage of the battery has fallen below a predetermined level that indicates a full discharge. The value in the NAC register 180 is always less than or equal to the value in the LMD register 182.

The serial port receives information regarding the value in the NAC register 180, the LMD register 182 and the DCR 184. Further, the output of the NAC register 180 is utilized by the microcontroller 64 to provide the available charge display on the actual battery-pack itself. A temperature translation operation is indicated by a block 186 that provides for an adaptive translation. When the temperature is greater than 10° C., the actual output of the NAC register 180 is provided. When the temperature is between –20° C. and +10° C., the value of the NAC register 180 is decreased by 20% of the full value indicated by the value stored in the LMD register 182. When the temperature is less than –20° C., the value in the NAG register 180 is reduced by 0.5 times the value stored in the LMD register 182, this indicating a full value.

Prior to being input to the NAC, the charge count is processed through a rate and temperature compensation process, indicated by a block 183. Additionally, the discharge count is also processed through a rate and temperature compensation process indicated by block 185. Additionally, the self-discharge count value is also temperature compensated, as indicated by temperature compensated block 187, prior to being input to the DCR 184 or the NAC 180.

The rate and temperature compensation blocks 183 and 185 allow the integrator count to be compensated for both temperature and charge/discharge rate before being entered into the NAC 180 or the DCR 184. The charge and discharge rate compensation values are referenced to a zero compensation for 1C charge and discharge rates. The charge compensation rates are less than 100%. The discharge compensation rates, if enabled by program pins 4 and 5, as described above with reference to Table 2, may be below 100% (>1.0 efficiency) for discharge rates with $V_{SR}<V_{SR1}$ and above 100% (<1.0 efficiency) for higher discharge rates.

A Charge Efficiency Compensation (CEC) value is provided that accounts for both charge rate compensation and charge temperature compensation. The charge rate compensation of the CEC adapts between a fast charge rate and a trickle charge rate at an uncompensated charge rate threshold of 0.15C to 0.32C (two counts/second decision threshold), with the specific threshold depending on the Program Full Count (PFC). Charge counting always initiates at the fast rate compensation. The compensations are 0.95 for a fast charge and 0.85 for a trickle charge. These selections conservatively understate charge being stored during most of the course of charge. In some cases, if a charge is terminated at almost but not quite full, then the NAC 180 may slightly overstate the available charge. This is because the charging efficiency worsens as the battery approaches full. If a charger carries a battery all the way to full, this overstatement will not occur.

The CEC provides for charge temperature compensation which adapts over three steps between nominal, warm and hot temperatures. If the temperature is above 30° C., the trickle charge will be compensated by a factor of 0.80 and the fast charge will be compensated by a factor of 0.95. For temperatures between 30°–40° C., the trickle charge is compensated by a factor of 0.65 and the fast charge is compensated by a factor of 0.80. For temperatures above 40° C., the trickle charge is compensated by factor of 0.55 and the fast charge is compensated at a value of 0.65. With respect to the above three steps, the approximate temperature factors that are applied are 1.00 for temperatures less than 30° C., 0.85 for temperatures between 30°–40° C. and 0.70 for temperatures greater than 40° C.

A Discharge Efficiency Compensation (DEC) value is provided that may be disabled or enabled through the PROG4 and PROG5 pins as described above with respect to Table 2. If the DEC is disabled, the discharge count will be decremented/incremented using a 1.0 factor. However, if the DEC is enabled, the discharge rate will be compensated at four rates based on three $V_{SR}$ thresholds. $V_{SR}$ thresholds allow the transitions to occur rapidly. There are five fixed compensation rates available (0.95, 1.00, 1.05, 1.15 and 1.25). The $V_{SR}$ threshold voltages after defining the rates may be programmed and stored in the ROM, which four defined rates can then be utilized. In one example, the discharge rate is changed from 0.95 to 1.00 at a threshold voltage of $V_{SR1}$=75 mv. The discharge compensation rate changes from 1.00 to 0.05 at a threshold voltage of $V_{SR2}$= 150 mv. The compensation changes from 1.05 to 1.15 at a threshold voltage $V_{SR3}$=206 mv. This is illustrated in Table 3.

TABLE 3

| Discharge Comp. Rate | $V_{SR}$ Threshold | Efficiency |
|---|---|---|
| 0.95 |  | 105% |
|  | $V_{SR1}$ = 75 mv |  |
| 1.00 |  | 100% |
|  | $V_{SR2}$ = 150 mv |  |
| 1.05 |  | 95% |
|  | $V_{SR3}$ = 206 mv |  |
| 1.15 |  | 87% |

The DEC value is also operable to provide for adaptive temperature compensation if enabled. At lower temperatures, the compensation will shift to a more severe compensation step, stopping at the most severe of the overall options. For temperatures above 10°, no shift is provided. However, for temperatures between 0°–10° C., the temperature compensation will be shifted by a factor of 0.05, such that, for example, a temperature rate compensation of 0.95 will be shifted to a factor of 1.00, etc. The most severe shift will be for temperatures less than –20° C. which will result in a shift of 0.30. Temperatures between –20° C. and –10° C. result in a shift of 0.20, and temperatures between –10° C. and 0° C. result in a shift of 0.10. These are illustrated in Table 4.

TABLE 4

| Temperature | Shift |
|---|---|
| 10° C. < T | No Shift; Nominal Compensation |
| 0° C. < T < 10° C. | Shift 1 (i.e., 0.95 becomes 1.00, etc.) |
| –10° C. < T < 0° C. | Shift 2 (i.e., 0.95 becomes 1.05, etc.) |
| –20° C. < T < –10° C. | Shift 3 (i.e., 0.95 becomes 1.15, etc.) |
| T < –20° C. | Shift 4 (i.e., 0.95 becomes 1.25, etc.) |

The self-discharge rate temperature compensation (SDTC) is programmed to be a nominal rate of 1/61*NAC or 1/30.5*NAC rate per day. This is the count rate for a battery within the 20°–30° C. temperature step. This count rate adapts across the eight steps from 0°–10° C. to a value greater than 80° C., doubling with each higher step, which step comprises 10° C. increments. The SDTC is illustrated in Table 5.

TABLE 5

| Temp. Step | Factor of Nominal Rate | Temp. Step | Factor of Nominal Rate |
| --- | --- | --- | --- |
| <10° C. | 0.25x | 40° C.–50° C. | 4x |
| 10° C.–20° C. | 0.50x | 50° C.–60° C. | 8x |
| 20° C.–30° C. | 1x | 60° C.–70° C. | 16x |
| 30° C.–40° C. | 2x | >80° C. | 32x |

Figure 9A:
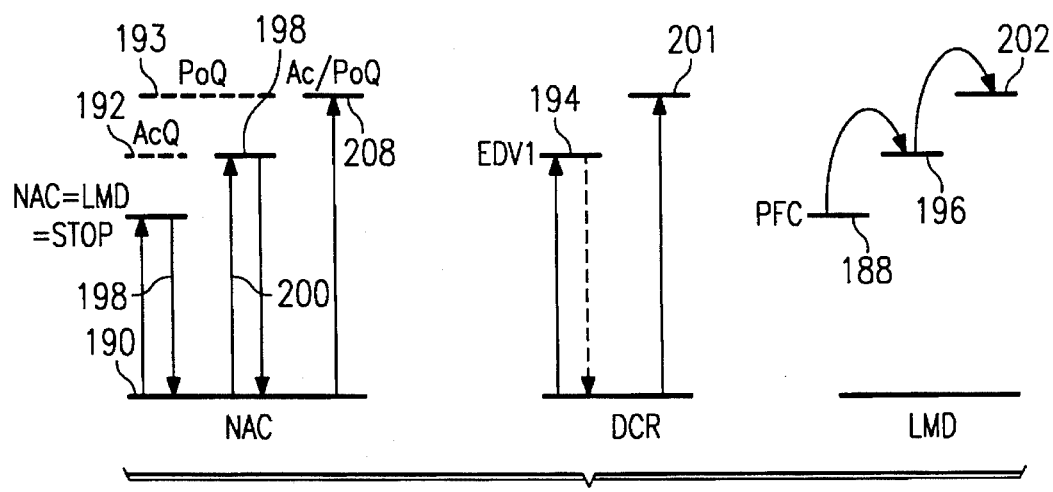
FIGS. 9a–9c illustrate diagrammatic views of the register for the nominal available charge register, the discharge count register and the last measured discharge register.
Figure 9B:
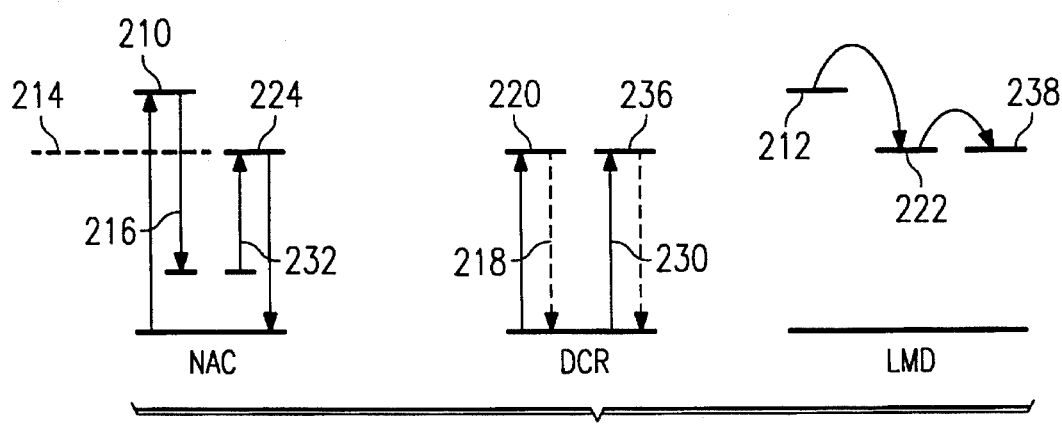
Figure 9C:
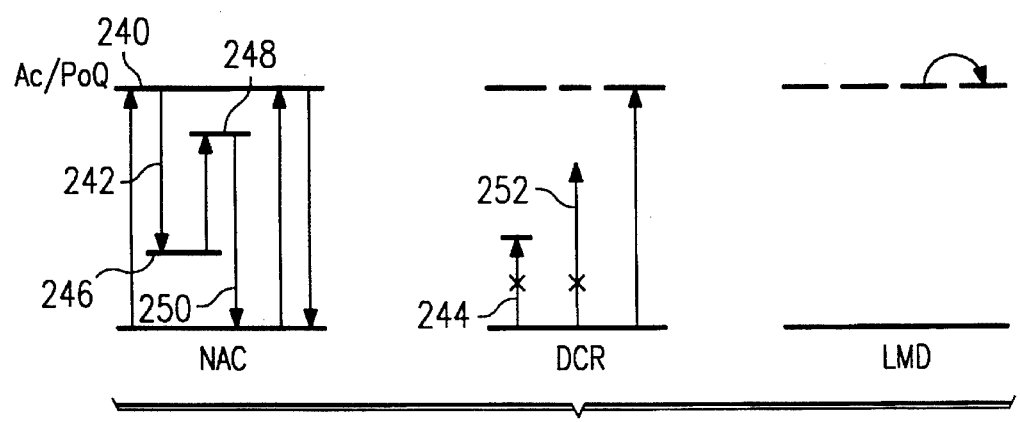

Referring now to FIGS. 9a–9c, there are illustrated diagrammatic views of the operation of the NAC register 180, LMD register 182 and DCR 184. With specific reference to FIG. 9a, there is illustrated a situation wherein the NAC register counts up to a count value equal to the LMD value, which is initially set to the Program Full Count (PFC) value, as indicated by a level 188. This level 188 essentially represents a count value, but, for illustrative purposes, it is represented as a level. Initially, the NAC operates from a zero value, represented by a point 190, the point 190 existing on a baseline. During a charge operation, the value in the NAC register 180 will increase up to a count value equal to the count stored in the LMD register 182 and will not exceed that level, even if the battery continues to charge. In the example in FIG. 9a, the battery does continue to charge to a level 192, representing the actual Q stored in the battery. Therefore, if the condition had not existed wherein the NAC value was limited by the LMD value, the count value in the NAC register 180 would have increased to the level 192. This example represents in the first process step a step whereby the battery was not fully charged on the first charge. Therefore, a potential Q level 193 exists to represent the potential Q of the battery, i.e., the value at which the NAC would reside if it represented the full Q of a fully charged battery.

In the next cycle, when the battery is discharged, the DCR 184 increases in value until it reaches a level 194. At the level 194, the battery has been discharged below the threshold voltage EDV1, which is the first End of Discharge Voltage threshold, which is approximately 1.05 volts for nickel chemistry. This represents a qualified transfer condition such that the value stored in the DCR 184 will now be transferred to the LMD register 182, raising the value in the LMD register 182 to a count level indicated by a level 196. Of course, during this time, the value stored in the NAC register 180 decreases, as indicated by a discharge count line 198. Therefore, the nominal available charge indicated by the NAC value in the register 180 is decremented. However, as will be described hereinbelow, this value at this point in the procedure is not accurate, nor is the value stored in the LMD register 182 accurate. The reason is that the actual Q represented by the line 192 is less than the potential Q represented by the line 193. As such, when the DCR 184 was incremented, it did not represent a discharge from a full charge level. During the second charge cycle, represented by the line 200, the charge represents a full charge. Therefore, the actual Q and the potential Q are both disposed at the line 193, even though the NAC value was limited by the value stored in the LMD register 182, represented by line 196.

In the next discharge operation, the DCR value in register 184 will increase in value from the base line to a fully-discharged value at a level 201. The DCR value in register 184 will increase in value from the base line to a fully discharged value at a level 201. The DCR value in register 184 was changed from the level 194 back to the base line in a reset operation, which reset operation can occur any time during the increase in the NAC value. When the value in the DCR register 184 reaches the fully discharged value 201, indicated by the voltage falling below the EDV1 value, a qualified transfer occurs and the count value stored in the LMD register 182 increases to a value represented by a level 202.

During the next charge operation, the NAC value goes from the base line to a level 208 that represents both the potential Q and the actual Q, thus providing an NAC value that is a valid. Therefore, it can be seen that the only information required by the battery capacity detect circuit is the amount of charge removed from the battery when discharging from a fully charged value to a fully discharged value followed by incrementing of a charge counter during a charge operation. This charge counter represents the actual charge in the battery, which charge level can be represented as a percentage of full. As such, if the overall capacity of the battery decreases, the level to which the NAC value can increase will be limited.

Referring now to FIG. 9b, there is illustrated an example wherein the battery capacity decreases for some reason over time and the value stored in LMD must also decrease. Initially, the NAC value has an initial value that is in error relative to the battery capacity, such that when it increases to a level 210, corresponding to an LMD level 212, it represents a value that is greater than the potential Q of the battery, which is indicated by a dotted line 214. On the first discharge operation thereafter, the NAC value will be decremented, as indicated by a downward count line 216 for the NAC value and an upward count value line 218 for the DCR 184. The DCR value will rise to a value 220, which indicates a full discharge. Since it is a full discharge, this will result in a qualified transfer, thereby decreasing the value stored in the LMD register 182 to a value 222. During this charge operation, the NAC value did not decrease to the previous baseline level, but to a higher level.

During the next charge operation, the NAC value will increase to a level 224, which represents the level stored in the LMD register 182, corresponding to level 222. NAC will not increment further. When the battery is fully charged, this does represent an accurate NAC value and, thereafter, the NAC value will represent the actual charge stored in the battery.

During the next discharge operation, as represented by an increasing count value arrow 230, NAC will decrease, as indicated by a down counting arrow 232, until the DCR value rises to a level 236, corresponding to the level 220. Again, this is a qualified transfer condition and this value will be transferred to the LMD register 182, as represented by a level 238. Of course, the LMD value has not changed since the battery condition has not changed. This will continue until some parameter of the battery has changed.

Referring now to FIG. 9c, there is illustrated a condition wherein the battery is not fully discharged. In the initial operation, the NAC value is incremented from the base line to a level 240, representing both the actual and the potential Q of the battery, i.e., this is a valid, fully charged level. On the next operation, as indicated by down counting arrow 242, the battery is partially discharged. The DCR value increases during this time, but not to a full level since a full discharge has not occurred and, as such, this does not correspond to a qualified transfer, this count value being indicated by an arrow 244 with an x through it. During the next operation, the NAC value is initiated from a level 246, which is greater than the base line, and increases to a level 248, which is less than the fully charged level at level 240. During the next operation, the battery is fully discharged, as indicated by a down count arrow 250 on the NAC register 180 and an increasing count arrow 252 on the DCR 184. However, even though the battery is fully discharged, a qualified transfer does not occur, since the previous cycle of the NAC did not represent a fully charged level. The next cycle represents the condition wherein NAC rises to a level equal to LMD and is then fully discharged. This will result in the DCR value of register 184 increasing to a fully discharged level after a fully charged level and allowing a qualified transfer. Therefore, the conditions for a qualified transfer in the illustrations of FIGS. 9a–9c require that a charge occur to what appears to be a fully charged level, as represented by the value in the LMD register 182, followed by a full discharge operation to adjust the value of the LMD register.

Figure 10:
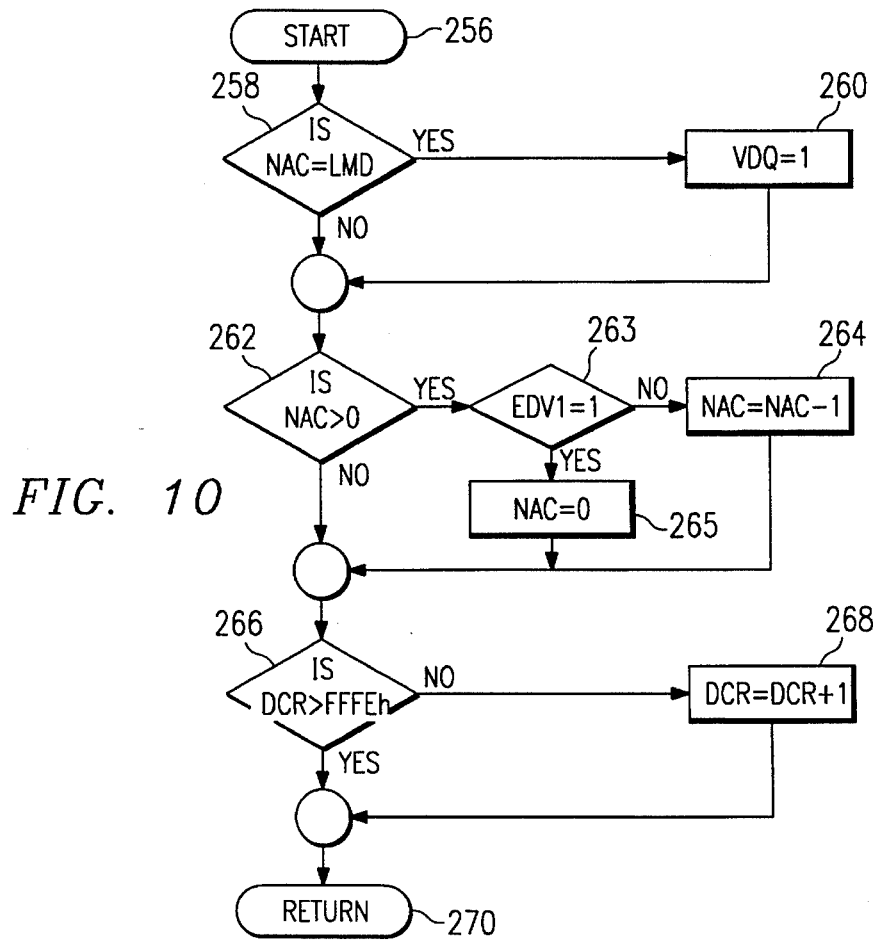
FIG. 10 illustrates a flowchart for the discharge count routine.

Referring now to FIG. 10, there is illustrated a flowchart for the discharge count routine. The flowchart is initiated at a start block 256 and then proceeds to a decision block 258 to determine if the NAC value is equal to the LMD value. If so, a flag VDQ is set, as indicated by a block 260, and then the program flows to a decision block 262. If the NAC value is not equal to the LMD value, the program also flows from decision block 258 to a decision block 262. Decision block 262 determines whether NAC is greater than zero. If so, the program flows to a decision block 263 to determine if EDV1 flag is equal to "1" and, if not, the program flows to a block 264 to decrement the NAC value. The output of block 264 flows to the input of a decision block 266. If the EDV1 flag is equal to "1", the program flows from the decision block 263 to a function block to set NAC equal to "0" and then to decision block 266. If the NAC value is not greater than zero, the program flows from decision block 262 to the input of decision block 266. Decision block 266 determines Whether the DCR value is greater than a predetermined value "FFFEh" to determine if an overflow condition exists. If it is not greater than the predetermined value, the program flows to a block 268 to increment the DCR value, and if it is greater than the predetermined value, the program flows from the decision block 266 to a return block 270, the output of block 268 also flowing to the return block 270. Therefore, the value in the DCR 184 is not allowed to exceed the value "FFFFh".

Figure 11:
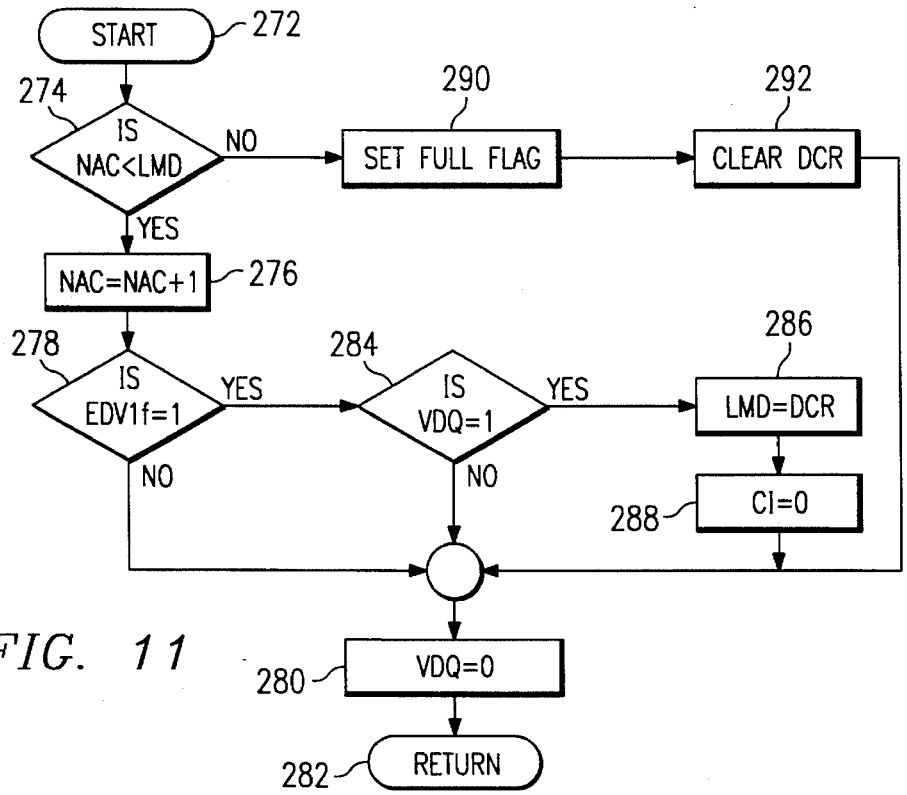
FIG. 11 illustrates a flowchart for the charge count routine.

Referring now to FIG. 11, there is illustrated a flowchart depicting the charge count routine. The program is initiated at a start block 272, then proceeds to a decision block 274 to determine whether the NAC value is less than the LMD value. If the NAC value is less than the LMD value, the program flows from the decision block 274 to a block 276 to increment the NAC value and then to a decision block 278 to determine whether the End of Discharge Voltage Flag (EDV1F) is equal to one. If it is not, this indicates a not empty condition, and the program flows to a block 280 to set the VDQ flag equal to zero and then to a return block 282. However, if the EDV1 flag is set to one, the program flows to a decision block 284 to determine whether the VDQ flag is set to one. If the VDQ flag is set, the program flows to a block 286 to set the LMD value equal to the DCR value and then to a block 288 to set the capacity inaccurate (CI) flag equal to zero, and then to the input of block 282, to set the VDQ flag equal to zero. If the VDQ flag is not set in decision block 184, the program would see this as an invalid discharge and would flow to the determine block 282 to again wait for another count.

If, during the initial count, the decision block 274 had indicated that the value of NAC was not less than LMD, i.e, was equal to or greater, the program would flow to a block 290 to set the "full" flag and then to a block 292 to clear the DCR 184 to a reset state, and then to the return block 282. Therefore, it can be seen that the LMD value is set equal to the DCR value whenever the EDV1 flag is set and the VDQ flag is set, indicating an End of Discharge Voltage condition wherein the charge operation was initiated at a point wherein the NAC value was equal to the LMD value and continued to a fully discharged state and that both temperature and self-discharge qualifications were met. Therefore, for the first pass through the flowchart of FIG. 11, the flowchart will increment the NAC value and flow through box 276 with VDQ being set equal to zero. This will continue until the value of NAC is equal to LMD, at which time the full flag will be set and the program will flow through the block 282. However, after a fully discharged operation, the program will increment the NAC value and also do a justified LMD transfer.

Figure 12:
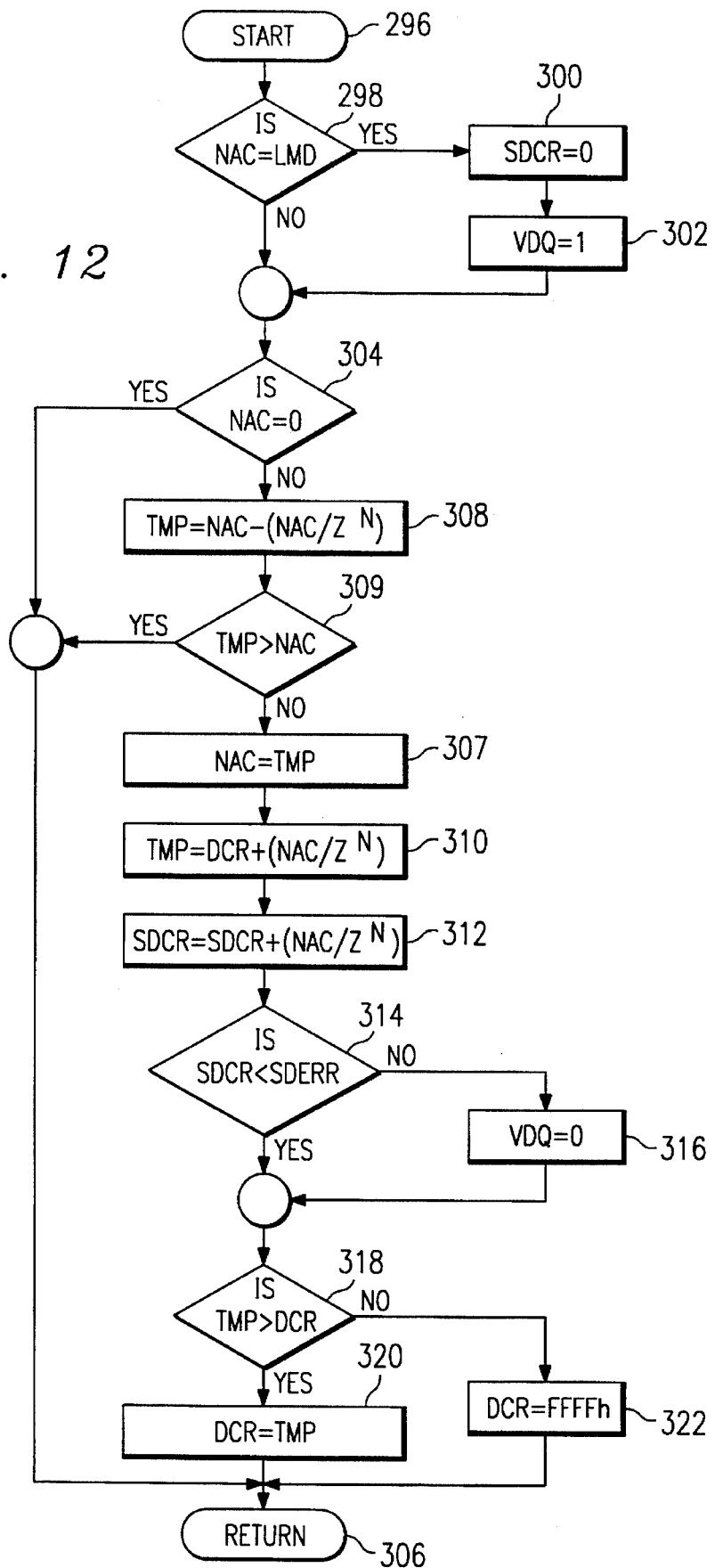
FIG. 12 illustrates a flowchart for the serf-discharge count routine.

Referring now to FIG. 12, there is illustrated a flow chart depicting the operation of a self-discharge count routine. The program is initiated at a start block 296 by a timer interrupt and then proceeds to a decision block 298 to determine if the NAC value is equal to the LMD value. If so, the Self Discharge Count Register (SDCR) value is set to zero in a block 300 and the VDQ flag is set to one in a box 302. If the NAC value is not equal to the LMD value, the program will flow to the input of a decision block 304, the program also flowing from the block 302 to the input of the decision block 304. The decision block 304 determines whether the NAG value is equal to zero. If it is equal to zero, the program flows to a return block 306. If it is not equal to zero, the program flows to a block 308, to set the TMP value equal to the NAC value decremented by a factor of $NAC/2^N$. The program then flows to a decision block 309 to determine if TMP is greater than NAC and, if so, the program flows to return block 306, this being an underflow condition. If TMP is less than NAC, then the program flows to a function block 307 to set NAC equal to TMP. The program then flows to a function block 310 to generate a TMP value, which represents the DCR value incremented by $NAC/2^N$. The SDCR value is incremented by $NAC/2^N$ in a block 312. The program then flows to a decision block 314 to determine whether the value in the self-discharge count register (SDCR) is less than the self-discharge error (SDERR). In the preferred embodiment, SDERR is represented by the value 4096 in a 16-bit register. If the SDCR value is not less than the SDERR value, the program flows to a block 316 to set the VDQ flag to zero, as indicated by a block 316. This qualifies that the DCR is no longer a valid indicator of LMD. The program then flows to the input of a decision block 318. If, however, the value of SDCR is less than SDERR, the program also flows to the input of decision block 318.

Decision block 318 determines whether the value stored in the temporary register TMP is greater than the DCR value, this providing a check for overflow. If no overflow condition is present, the program flows along a "Y" path to a block 320 to set the value of DCR equal to TMP. If an overflow condition exists, the program flows to a function block 322 to set the DCR value to a full value. The program flows from blocks 320 and 322 to the return block 306.

Figure 13:
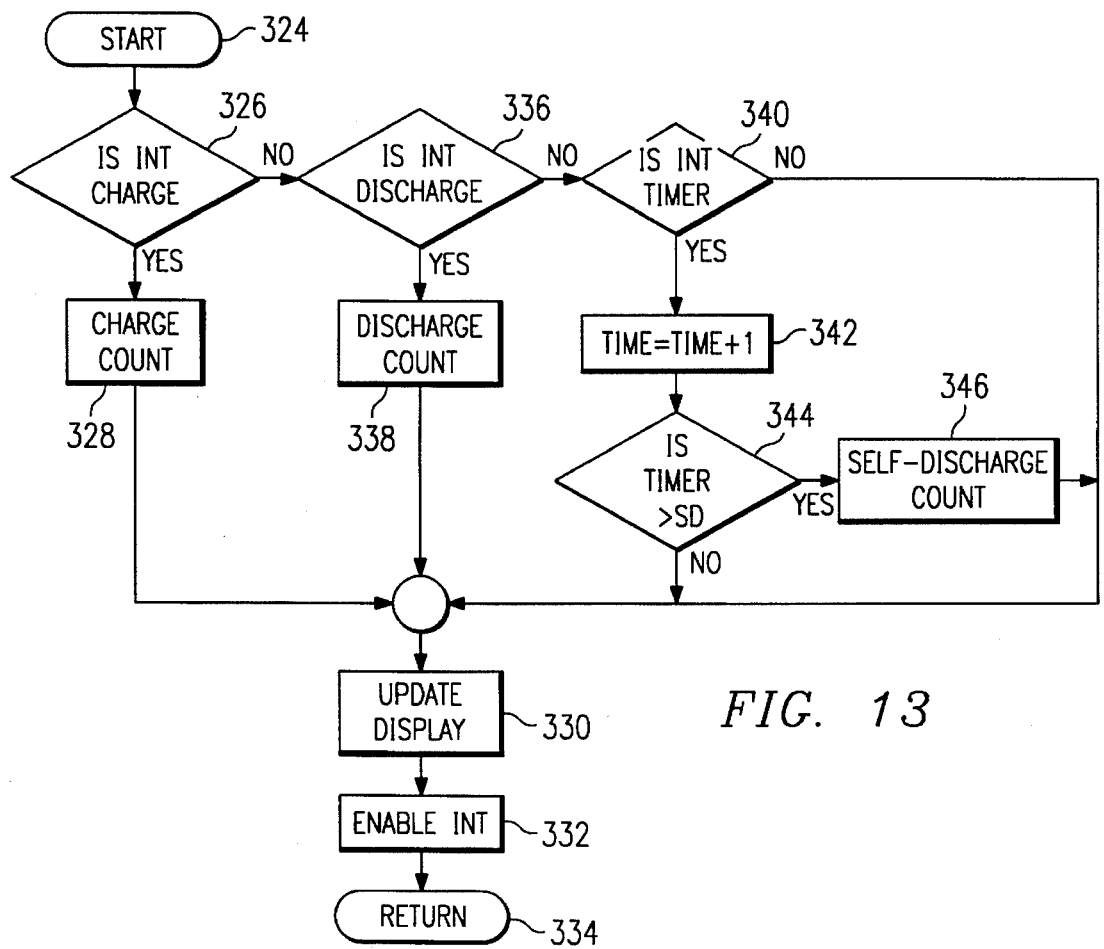
FIG. 13 illustrates a flowchart for handling the interrupt.

Referring now to FIG. 13, there is illustrated a flowchart for the interrupt handler. The program is initiated at a start block 324 and then flows to a decision block 326 to determine whether a charge interrupt has been generated. If so, the charge count routine is initiated, as indicated by block 328. After the charge count routine has been executed, the program flows to a block 330, wherein the display is updated and then to a block 332 to enable the interrupt and then to a return block 334.

If the interrupt is not a charge interrupt, the program flows to a decision block 336 to determine whether the interrupt is a discharge interrupt. If it is a discharge interrupt, the program flows to a block 338 to initiate the discharge count routine and then to the block 330. If the interrupt is not a discharge interrupt, the program flows to a decision block 340 to determine whether the interrupt is a timer interrupt, this indicating the self-discharge timer output from counter 88. If it is a timer interrupt, the program flows to a block 342 to increment the time by one and to a decision block 344 to determine whether the timer count is greater than SD. The SD value represents a variable that is exponentially related to temperature and is derived from the output of the comparator 84 during the determination of the TEMP input to multiplexer 86. This allows the self-discharge rate to be temperature compensated. If so, the program flows to a block 346 to initiate the self-discharge count routine. If not, the program flows to the update display block 330. After the self-discharge count routine has been completed, the program flows to the Update display 330. Also, if the interrupt is not a timer interrupt, the program would also flow from the decision block 340 to the input display block 330.

In summary, there has been provided a battery capacity detect circuit that is operable to work independently of any information about the actual charge in the battery. The battery detect circuit receives information about charge input to the battery or charge extracted from the battery. Separate software count registers are provided for keeping track of available charge, which is the function of both charge input to the battery and extracted from the battery, and a discharge register for indicating only a discharge operation. Whenever discharge is measured from an apparent full condition to a fully discharged condition a battery capacity can be determined from the amount of charge extracted from the battery from the apparent full condition. The available charge value is then limited to this new capacity such that it then represents the percentage of the full capacity. Therefore, the measurement of the capacity of the battery is valid whenever the battery traverses from an apparent full condition to a fully discharged condition subject to certain time and temperature qualifications, which fully discharged condition can be measured by determining that the voltage of the battery has fallen below a predetermined voltage.

Although the preferred embodiment has been described in detail, it should be understood that various changes, substitutions and alterations can be made therein without departing from the spirit and scope of the invention as defined by the appended claims.

What is clamed is:

1. A display system for a battery monitoring system having a battery that has a rated maximum capacity and an actual capacity, comprising:

a battery monitoring circuit for determining the charge state of the battery and the actual capacity of the battery and representing the charge state of the battery with a charge state value and the actual capacity of the battery as an actual capacity value;

a register for storing a user programmed rated maximum capacity value representing the rated maximum capacity of the battery as defined by the user;

a display element for displaying the charge state of the battery which ranges from a lower capacity value to an upper capacity value; and a display controller for operating said display element in either an absolute full mode or in a relative full mode, said display controller when operating in said absolute full mode operable to set said upper capacity value to said maximum capacity value stored in said register and to display the charge state value in said display element as relative to said maximum capacity value, said display controller when operating in said relative full mode operable to set said upper capacity value to the actual capacity and to display in said display element the charge state.

2. The display system of claim 1, and further comprising means for inputting said maximum capacity value to said register.

3. The display system of claim 2, wherein said means for inputting includes a serial port for receiving a serial input data stream that includes said maximum capacity value.

4. The display system of claim 1, wherein said display controller includes a switching mechanism for switching between said absolute full mode and said relative full mode.

5. The display of claim 4, wherein said switching mechanism comprises circuitry connected to an external pin to the display system, which said external pin comprises a programming pin, which said programming pin can be externally programmed to at least a first or a second state, with said first state representing said absolute full mode and said second state representing said relative full mode.

6. The display of claim 4, wherein one of said absolute full mode and said relative full mode is preselected upon power up of the display system.

7. The display of claim 1, and further comprising a temperature translation device for varying said charge state value displayed by said display element as a function of temperature by varying the value of said determined charge state value determined by said battery monitoring circuit by a predetermined offset value that is a function of temperature.

8. The display of claim 7, wherein said temperature translation device is operable to vary the value of the determined charge state value in discrete steps as a function of temperature.

9. A method for displaying the charge state of a battery that has a rated maximum capacity and an actual capacity, comprising the steps of:

determining the charge state of the battery and the actual capacity of the battery and representing the charge state of the battery as a charge state value and representing the actual capacity of the battery as an actual capacity value;

storing a user programmed rated maximum capacity value representing the capacity of the battery when new in a register as defined by the user;

providing a display element;

displaying the determined charge state value on the display element ranging from a lower capacity value to an upper capacity value;

operating the display element in either an absolute full mode or a relative full mode;

when operating in the absolute full mode, the upper capacity value of the display element is set to the maximum capacity value stored in the register and displaying the charge state value is displayed as a value relative to the maximum capacity value; and when operating the display element in the relative full mode, the upper capacity value is set to the determined actual capacity the charge state value is displayed as a value relative to the determined actual capacity value.

10. The method of claim 9, and further comprising the step of generating the rated maximum capacity value and storing the generated rated maximum capacity value in the register.

11. The method of claim 9, and further comprising, switching between the absolute full mode and the relative full mode.

12. The method of claim 11, and further comprising, providing a programming pin that has associated therewith a first programming state associated with the absolute full mode and a second programming state associated with the relative full mode, wherein the step of switching operates in response to the programming pin being at the first programming state or the second programming state.

13. The method of claim 11, and further comprising the step of preselecting either the absolute full mode or the relative full mode upon an external power up command being generated.

14. The method of claim 9, and further comprising varying the determined charge state value as a function of temperature before it is displayed on the display element, the value of the determined charge state value varied by a predetermined offset value that is a function of temperature.

15. The method of claim 14, wherein the step of varying the determined charge state value by a predetermined offset value that is a function of temperature comprises varying the value of the determined charge state value in discrete steps.

* * * * *

UNITED STATES PATENT AND TRADEMARK OFFICE
CERTIFICATE OF CORRECTION

PATENT NO. : 5,454,710

DATED : October 3, 1995

INVENTOR(S) : Landau, et al.

It is certified that error appears in the above-indentified patent and that said Letters Patent is hereby corrected as shown below:

On the Title Page:

Item [73],
Replace the name of the Assignee "Benchmarg" with --Benchmarq--.

In the Abstract:

Line 3, replace "convened" with --converted--.

Column 1, line 24, delete replace "o operation" with --operation--.

Column 1, line 43, replace "mount" with -- amount--.

Column 1, line 47, replace "manufacturers" with --manufacturer's--.

Column 2, line 3, replace "flail" with --full--.

Column 2, line 30, replace "dement" with --element--.

UNITED STATES PATENT AND TRADEMARK OFFICE
CERTIFICATE OF CORRECTION

PATENT NO. : 5,454,710

DATED : October 3, 1995

INVENTOR(S) : Landau, et al.

It is certified that error appears in the above-indentified patent and that said Letters Patent is hereby corrected as shown below:

Column 3, line 21, replace "serf-discharge" with --self-discharge--.

Column 5, line 36, replace "Combined" with --combined--.

Column 6, Table I, replace "full count" with --PFC full count--.

Column 7, line 7, begin a new paragraph with the sentence "The PROG4 and PROG5 pins provide a 3-function selection input."

Column 9, line 1, replace "Will" with --will--.

Column 9, line 22, replace "a count" with --count--.

Column 10, line 9, replace "(he" with --the--.

Column 10, line 34, replace "Whatever" with --Whenever--.

Column 10, line 52, begin a new paragraph with the sentence "Referring now to FIG. 8, there is illustrated an operational overview of the battery detect circuit."

UNITED STATES PATENT AND TRADEMARK OFFICE
CERTIFICATE OF CORRECTION

PATENT NO. : 5,454,710            Page 3 of 4

DATED : October 3, 1995

INVENTOR(S) : Landau, et al.

It is certified that error appears in the above-indentified patent and that said Letters Patent is hereby corrected as shown below:

Column 10, line 63, replace "NAG" with --NAC--.

Column 11, line 24, replace "NAG" with --NAC--.

Column 13, line 58, replace "fine" with --line--.

Column 15, line 38, replace "Whether" with --whether--.

UNITED STATES PATENT AND TRADEMARK OFFICE
CERTIFICATE OF CORRECTION

PATENT NO. : 5,454,710
DATED : October 3, 1995
INVENTOR(S) : Landau et al.

It is certified that error appears in the above-indentified patent and that said Letters Patent is hereby corrected as shown below:

Column 16, line 32, replace "NAG" with --NAC--.

Column 17, line 16, replace "adecision" with --a decision--.

Column 17, line 24, replace "Update" with --update--.

Signed and Sealed this

Thirteenth Day of August, 1996

Attest:

BRUCE LEHMAN

Attesting Officer

Commissioner of Patents and Trademarks